United States Patent
Tremblay

(10) Patent No.: US 10,079,554 B2
(45) Date of Patent: Sep. 18, 2018

(54) HYBRID RECTIFIER CIRCUIT FOR RECTIFYING A LINE CURRENT

(71) Applicant: IMALOG INC., Montréal (CA)

(72) Inventor: Marco Tremblay, Pierrefonds (CA)

(73) Assignee: IMALOG INC., Montréal (CA)

( * ) Notice: Subject to any disclaimer, the term of this patent is extended or adjusted under 35 U.S.C. 154(b) by 0 days.

(21) Appl. No.: 15/786,561

(22) Filed: Oct. 17, 2017

(65) Prior Publication Data

US 2018/0123474 A1    May 3, 2018

Related U.S. Application Data

(60) Provisional application No. 62/410,026, filed on Oct. 19, 2016.

(51) Int. Cl.
*H02M 7/217* (2006.01)
*H02M 3/335* (2006.01)
(Continued)

(52) U.S. Cl.
CPC ...... *H02M 7/2176* (2013.01); *G01R 19/0092* (2013.01); *H02M 1/08* (2013.01);
(Continued)

(58) Field of Classification Search
CPC ............ H02M 1/08; H02M 7/17; H02M 7/23; H02M 2001/0006
See application file for complete search history.

(56) References Cited

U.S. PATENT DOCUMENTS 3,851,240 A    11/1974    Park et al.

4,519,024 A    5/1985    Federico et al.
(Continued)

FOREIGN PATENT DOCUMENTS

WO    0135509    5/2001
WO    2010050958    5/2010
(Continued)

OTHER PUBLICATIONS

Abstract of Three-Phase Diode Rectifier With Low Harmonic Distortion to Feed Capacitive Loads, F. Daniel et al., Applied Power Electronics Conference and Exposition, Conference Proceedings, IEEE, Mar. 3, 1996.
(Continued)

*Primary Examiner* — Yusef A Ahmed
(74) *Attorney, Agent, or Firm* — Bereskin & Parr LLP/S.E.N.C.R.L., s.r.l.

(57) ABSTRACT

A hybrid rectifier is provided including a top diode for conducting current during a positive current portion of a line current, a top transistor connected in parallel to the top diode, a bottom diode for conducting current during a negative current portion of the line current, and a bottom transistor connected in parallel to the bottom diode. A hybrid-rectifier controller is connected to the top transistor and the bottom transistor for implementing a transistor control strategy such that, during the positive current portion of the line current, the top diode conducts current and the bottom transistor conducts current only when the line current is below a sinusoidal reference current. Similarly, during the negative current portion of the line current, the bottom diode conducts current and the top transistor conducts current only when the line current is above the sinusoidal reference current.

14 Claims, 12 Drawing Sheets

(51) Int. Cl.
  *H02M 7/17* (2006.01)
  *H03K 17/687* (2006.01)
  *H02M 1/08* (2006.01)
  *G01R 19/00* (2006.01)
  *H02M 7/23* (2006.01)
  *H02M 1/00* (2006.01)

(52) U.S. Cl.
  CPC ......... *H02M 3/33592* (2013.01); *H02M 7/17* (2013.01); *H02M 7/23* (2013.01); *H03K 17/687* (2013.01); *H02M 2001/0006* (2013.01)

(56) References Cited

U.S. PATENT DOCUMENTS

| | | | | |
|---|---|---|---|---|
| 5,486,743 | A * | 1/1996 | Nagai | H02P 6/06 318/400.06 |
| 5,633,793 | A * | 5/1997 | Lee | H02M 7/062 363/127 |
| 5,872,705 | A | 2/1999 | Loftus, Jr. et al. | |
| 6,038,148 | A | 3/2000 | Farrington et al. | |
| 6,038,152 | A * | 3/2000 | Baker | H02M 7/219 363/126 |
| 6,631,080 | B2 | 10/2003 | Trimble et al. | |
| 6,765,425 | B2 | 7/2004 | Vaysse | |
| 7,006,366 | B2 | 2/2006 | Panda et al. | |
| 7,148,661 | B2 | 12/2006 | Trainer et al. | |
| 7,190,143 | B2 * | 3/2007 | Wei | H02M 7/219 318/606 |
| 8,643,350 | B2 | 2/2014 | Gao | |
| 9,829,226 | B2 * | 11/2017 | Hatakeyama | F25B 31/02 |
| 9,919,610 | B1 * | 3/2018 | Sarwat | B60L 11/182 |
| 2001/0022736 | A1 | 9/2001 | Suzuki | |
| 2003/0048651 | A1 * | 3/2003 | Trimble | H02M 7/2173 363/125 |
| 2005/0226298 | A1 * | 10/2005 | Asai | H02M 7/219 372/50.1 |
| 2008/0068868 | A1 | 3/2008 | Williams | |
| 2011/0309778 | A1 | 12/2011 | Iwahori | |
| 2012/0176084 | A1 * | 7/2012 | Klaes | B60L 11/1803 320/107 |
| 2013/0094258 | A1 | 4/2013 | Royak et al. | |
| 2013/0258725 | A1 * | 10/2013 | Colombi | H02J 3/26 363/37 |
| 2013/0269370 | A1 * | 10/2013 | Hatakeyama | F25B 13/00 62/56 |
| 2014/0070750 | A1 | 3/2014 | Fok | |
| 2015/0124505 | A1 * | 5/2015 | Wang | H02M 7/219 363/126 |
| 2015/0365006 | A1 | 12/2015 | Choi | |
| 2016/0072376 | A1 | 3/2016 | Ahlers et al. | |
| 2016/0111972 | A1 * | 4/2016 | Wolf | H02M 7/219 363/127 |
| 2017/0045596 | A1 * | 2/2017 | Driessen | G01R 33/3852 |
| 2017/0170743 | A1 * | 6/2017 | Medagam | H02M 5/458 |

FOREIGN PATENT DOCUMENTS

| | | |
|---|---|---|
| WO | 2011139975 | 11/2011 |
| WO | 2015030883 | 3/2015 |

OTHER PUBLICATIONS

Abstract of The Essence of Three-Phase PFC Rectifier Systems, J.W. Kolar et al., Swiss Federal Institute of Technology (ETH) Zurich, Power Electronic Systems Laboratory, May 4, 2012, IEEE Transactions on Power Electronics, vol. 28, Issue 1.
Abstract of Recent Advances and Industrial Applications of Multi-level Converters, Kouro et al., IEEE Transactions on Industrial Electronics (vol. 57, Issue: 8, Aug. 2010).
Elasser et al., "Silicon Carbide Benefits and Advantages for Power Electronics Circuits and Systems", Proceedings of the IEEE, vol. 90, No. 6, Jun. 2002.
English Abstract of CN101499771(A), "Frequency-changing speed-regulating driver for energy feedback three phase motor with three phase electric power", published on Aug. 5, 2009.
English Abstract of CN102790543(A), "Synchronous rectification system", published on Nov. 21, 2012.
English Abstract of EP3002868(A1), "Hybrid M2C diode rectifier", published on Apr. 6, 2016.
English Abstract of WO2010073602(A1), "AC-DC Converter", published on Jul. 1, 2010.
English Abstract of WO2013118813(A1), "Semiconductor power conversion device", published on Aug. 15, 2013.
Lechat Sanjuan, "Voltage Oriented Control of Three-Phase Boost PWM Converters", Master of Science Thesis in Electric Power Engineering, Department of Energy and Environment, Division of Electric Power Engineering, Chalmers University of Technology, Göteborg, Sweden, 2010.
Visser, "Active Converter Based on the Vienna Rectifier Topology Interfacing a Three-Phase Generator to a DC-Bus", Submitted in partial fulfillment of the requirements for the degree Master of Engineering (Electrical) in the Faculty of Engineering, the Built Environment and Information Technology, University of Pretoria, Mar. 2007.
"35 kW Active Rectifier with Integrated Power Modules", by Peter Wiedemuth, Hüttinger Elecktronik GmbH + Co. KG, Germany, Serge Bontemps, Microsemi PPG power module Products, France, Johann Miniböck, m-pec, Austria and ETH Zurich, power electronic systems laboratory, Switzerland. [online], [retrieved on Oct. 17, 2017]. Retrieved from the Internet.

* cited by examiner

HYBRID RECTIFIER CIRCUIT FOR RECTIFYING A LINE CURRENT

CROSS-REFERENCE TO RELATED APPLICATIONS

The present application claims priority to U.S. 62/410,026 filed on Oct. 19, 2016, which is hereby incorporated by reference in its entirety.

FIELD

The described embodiments relate to the power electronics.

BACKGROUND

A rectifier is a device used to convert the electrical supply provided by a utility company in alternating current form (AC) into the direct current form (DC) that is needed by some applications. Electronic rectifiers are used in most AC/DC power supplies, motor drives (variable frequency or servo), battery chargers, etc. Almost all electronic devices powered by an electrical distribution network use a rectifier. There are many types of rectifiers from simple to complex ones, each offering difference levels of performance.

Typically, the simplest rectifiers use a number of diodes. These diode rectifiers have the characteristic of producing a significant level of current distortion, which is unacceptable for some applications, such as those that are subject to regulations or standards such as IEEE 519.

Active rectifiers have been developed in order to achieve better levels of current distortion than diode rectifiers. Traditionally, the goal has been to significantly reduce distortion beyond the limits set out by regulations and standards. Active rectifiers are more complex than diode rectifiers, and use active switches (typically transistors) to control the flow of current. However, active rectifiers have an associated cost that is higher than a diode rectifier, since the transistors used must be capable of conducting relatively high current, which makes them expensive.

Furthermore, active rectifiers typically have low efficiency at partial loads, due to the continual switching of the transistors, which produces losses even when the load goes to zero. For some applications and industries, the efficiency of known active rectifiers is unacceptably low, or, at the very least, represents a substantial problem.

SUMMARY

In a first aspect, some embodiments of the invention provide a hybrid rectifier circuit for rectifying an alternating current. For each AC phase, the hybrid rectifier circuit comprises a top diode for conducting current during a positive current portion of the alternating current and a top transistor connected in parallel to the top diode. The hybrid rectifier further comprises a bottom diode for conducting current during a negative current portion of the alternating current and a bottom transistor connected in parallel to the bottom diode. A hybrid rectifier controller is connected to the top transistor and the bottom transistor for switching the top transistor and the bottom transistor. According to some embodiments, the control can be designed in order to keep the transistor switching to a minimum. During the positive current portion of the alternating current, the bottom transistor is switched so that the bottom transistor conducts current when the current through the top diode is below a sinusoidal reference current, the bottom transistor is switched so that the bottom transistor does not conduct current when the current through the top diode is above the sinusoidal reference current. Similarly, during the negative current portion of the alternating current, the top transistor is switched so that the top transistor conducts current when the current through the bottom diode is above the sinusoidal reference current, and the top transistor is switched so that the top transistor does not conduct current when the current through the bottom diode is below the sinusoidal reference current.

According to some embodiments, the hybrid rectifier can be implemented as a three-phase hybrid rectifier, with a top transistor, top diode, bottom transistor, bottom diode, and hybrid-rectifier controller for each phase.

In a second aspect, some embodiments of the invention provide a hybrid rectifier circuit for rectifying an alternating current. The hybrid rectifier circuit comprises a top transistor for conducting current during a positive current portion of the alternating current and switching during negative current portion of the alternating current. The hybrid rectifier circuit further comprises a bottom transistor for conducting current during the negative current portion of the alternating current and switching during the positive current portion of the alternating current. A hybrid-rectifier controller is connected to each of the top and bottom transistor for switching the bottom transistor during the positive portion of the alternating current when the current through the top transistor is below a sinusoidal reference current, and switching the top transistor during the negative portion of the alternating current when the current through the bottom transistor is above the sinusoidal reference current.

According to some embodiments, the transistors in the hybrid rectifier may be field-effect transistors (FETs).

In a third aspect, some embodiments of the invention provide a hybrid rectifier circuit for power regeneration. The hybrid rectifier circuit comprises a top diode for conducting freewheeling current during a positive current portion of the alternating current and a top transistor connected in parallel to the top diode. The hybrid rectifier circuit further comprises a bottom diode for conducting freewheeling current during a negative current portion of the alternating current and a bottom transistor connected in parallel to the bottom diode. A hybrid-rectifier controller is connected to the top transistor and the bottom transistor such that, during the positive current portion of the alternating current, the bottom transistor is switched so that the bottom transistor conducts current when the current through the bottom transistor is below a sinusoidal reference current, and the bottom transistor is switched so that the bottom transistor does not conduct current when the current through the bottom transistor is above the sinusoidal reference current. During the negative current portion of the alternating current, the bottom transistor is switched so that the top transistor conducts current when the current through the top transistor is above the sinusoidal reference current, and the top transistor is switched so that the top transistor does not conduct current when the current through the top transistor is below the sinusoidal reference current.

In a fourth aspect, some embodiment of the invention provide a hybrid rectifier for filtering harmonics of a parallel high-power rectifier, comprising a hybrid rectifier connected in parallel to the high-power rectifier.

BRIEF DESCRIPTION OF THE DRAWINGS

A preferred embodiment of the present invention will now be described in detail with reference to the drawings, in which.

DESCRIPTION OF EXEMPLARY EMBODIMENTS

Figure 1:
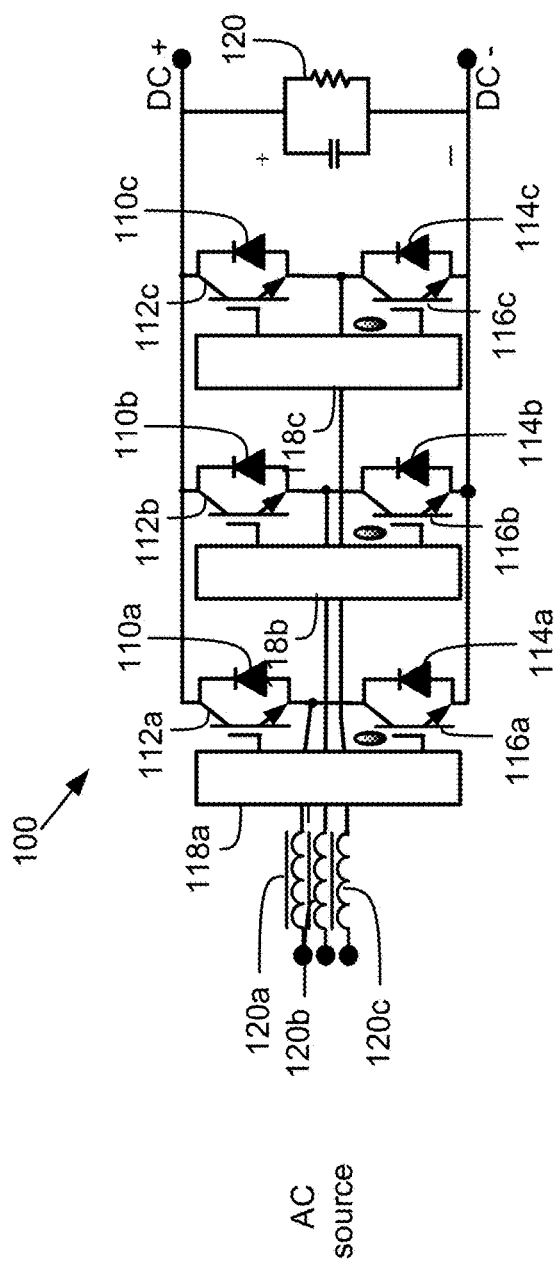
FIG. 1 is a circuit diagram of a hybrid rectifier according to some embodiments.

Referring to FIG. 1, there is shown a circuit diagram of a hybrid rectifier 100. Generally, the hybrid rectifier 100 mitigates the problems presented by known active rectifiers and diode rectifiers by combining the strengths of a diode rectifier and the strengths of an active rectifier. While the schematic diagram of the hybrid rectifier 100 bears some similarity to a known active rectifier, it is important to understand that the component sizing for the hybrid rectifier is different than for an active rectifier. As such, the hybrid rectifier produces fewer losses as compared to an active rectifier, while, at the same time, providing improved efficiency.

In particular, a significant difference between the hybrid rectifier 100 and a known active rectifier is the control technique. Contrary to the active rectifier, the simpler phase by phase control circuit of the hybrid rectifier can be embedded for each phase leg of a multi-phase rectifier, thereby eliminating the isolated signal usually needed for an active rectifier. Any known phase current and DC bus voltage sensor can be used as the implementation is not critical to the operation.

The hybrid rectifier 100 is shown as a three-phase hybrid rectifier, and the nomenclature "a", "b", and "c" is used to denote each of the three phases. According to some embodiments, a single-phase hybrid rectifier may be used, for example, comprising one (or two) of the component sets "a", "b", or "c" corresponding to a single phase in the hybrid rectifier 100.

The hybrid rectifier 100 comprises a top diode 110a in parallel with a top transistor 112a, which together form a top switch. The bottom switch comprises a bottom diode 114a in parallel with a bottom transistor 116a as shown. The diodes 110a and 114a with the transistors 112a and 116a correspond to one phase of the three-phase hybrid rectifier 100. Similarly, the hybrid rectifier 100 comprises diodes 110b, 110c, 114b, 114c and transistors 112b, 112c, 116b, 116c, corresponding to the other two phases.

As used herein, the term "transistor" is used to represent a fast semiconductor switch capable of being commutated on and off at will, for example, but not limited to a bipolar junction transistor (BJT), an insulated-gate bipolar transistor (IGBT), any type of field effect transistor (FET) such as; metal-oxide-semiconductor field-effect-transistor (MOSFET), or junction gate field effect transistor (JFET), a gate turn-off thyristor (GTO), and a forced-commutated thyristor. A person skilled in the art will appreciate that other devices may be used as well.

As used herein, the terms "top" and "bottom" are used in respect of the components on a rectifier schematic (e.g. top rectifier switch, top diode, top transistor, bottom rectifier switch, bottom diode, bottom transistor). As will be appreciated by a person skilled in the art, the terms "top" and "bottom" generally refer to the role of a component as a rectifier, and not to a specific circuit layout or topology. For example, a "top diode" is used to rectify the positive current portion (i.e. half cycle) of an alternating current, regardless of any particular physical layout of the components.

A hybrid-rectifier controller 118a is connected to both the top transistor 112a and the bottom transistor 116a in order to control the state of the transistors. As shown in FIG. 1 (an IGBT transistor is shown by way of example), the hybrid-rectifier controller 118a is connected to the gate of the top transistor 112a and the gate of the bottom transistor 116a. It will be appreciate that, for other types of transistors, the hybrid-rectifier controller 118a may be connected accordingly, such as to the base of a transistor instead of the gate. As described herein, with this circuit topology, the hybrid-rectifier controller 118a can be used to operate the hybrid rectifier 100 between a simple diode-rectifier mode and a more complex active-rectifier mode. According to some embodiments, the hybrid rectifier 100 can be used by switching between these modes, thereby improving the harmonic-distortion issues of simple diode rectifiers while being simpler to implement and/or less expensive than an active rectifier As previously described the hybrid rectifier can be implemented as a three-phase hybrid rectifier, such as the hybrid rectifier 110 shown in FIG. 1. In the three-phase case, separate hybrid-rectifier controllers (e.g. hybrid-rectifier controllers 118a, 118b, and 118c) are used for each phase. In this case, multiple controllers may be mounted on a single circuit board if desired. Furthermore, the hybrid rectifier can be used for multi-level rectifiers as well. Alternatively, according to some embodiments, a single hybrid-rectifier controller may be used to control more than one phase.

The hybrid-rectifier controller 118a can be used to implement a switching strategy for the transistors that keeps the diodes as the main rectification elements. In this case, both the top rectifier switch and the bottom rectifier switch are made by combining diodes with transistor, and using the diodes as the main rectification element. This is in contrast to known active rectifiers, in which transistors are the main rectification element.

In other words, the control strategy disclosed herein relies on a different operation of the components as compared to known active rectifiers. According to the control strategy used for the hybrid rectifier, the transistors are only used to direct the current in the diodes when the phase current would normally be lower than desired (e.g. as compared to a desired reference current). In the case of known active rectifiers, the DC bus voltage needs to be boosted by at least 10% to 30% above the diode rectifier's level to operate, whereas with the hybrid rectifier, the transistors switch intermittently and the DC bus voltage is kept at a lower average value very close to the diode rectifier's level.

In some embodiments, the hybrid rectifier can retain many of the characteristics of the active rectifier, but with lower losses and/or a lower cost similar to the diode rectifier. For example, the hybrid rectifier can have lower switching and conduction losses than the active "boost" rectifier, and can be more efficient, especially at lower power, where the efficiency of active rectifiers is dramatically reduced.

Furthermore, the transistors in the hybrid rectifier may not be affected by dead time or shoot through due to the single polarity modulation. Thus, slow turn-off devices can be used, since they usually produce lower conduction losses.

Another aspect of the hybrid rectifier, in some cases, is a lower EMI and ripple-current emission as compared to an active rectifier, due to a reduced number of switching events, and/or switching events occurring at lower currents. Furthermore, the hybrid rectifier may have a smaller DC bus capacitance as compared to an active rectifier, which can be used to maintain stability or to reduce the DC voltage ripple of the diode rectifier.

According to some embodiments, the hybrid rectifier may be built using smaller transistors than those necessary in an active rectifier, thus leading to cost reduction of the hybrid rectifier as compared to an active rectifier.

While the hybrid rectifier may be implemented to have improved efficiency over an active rectifier, it may also be implemented to have lower current distortion (harmonics) than a diode rectifier. In other words, the control strategy can be implemented in order to limit the distortion to an acceptable level while minimizing the transistor conduction and switching losses.

Furthermore, the hybrid rectifier can be implemented to have a smoother DC bus voltage than a diode rectifier. For example, a three-phase hybrid rectifier may have variation in the DC buss voltage in the range of 2% to 5% whereas the diode rectifier may be around 14%. Nonetheless, the hybrid rectifier may operate with a similar (i.e. "low") DC bus voltage as compared to a diode rectifier, which can have the effect of reducing component stress.

Figure 2:
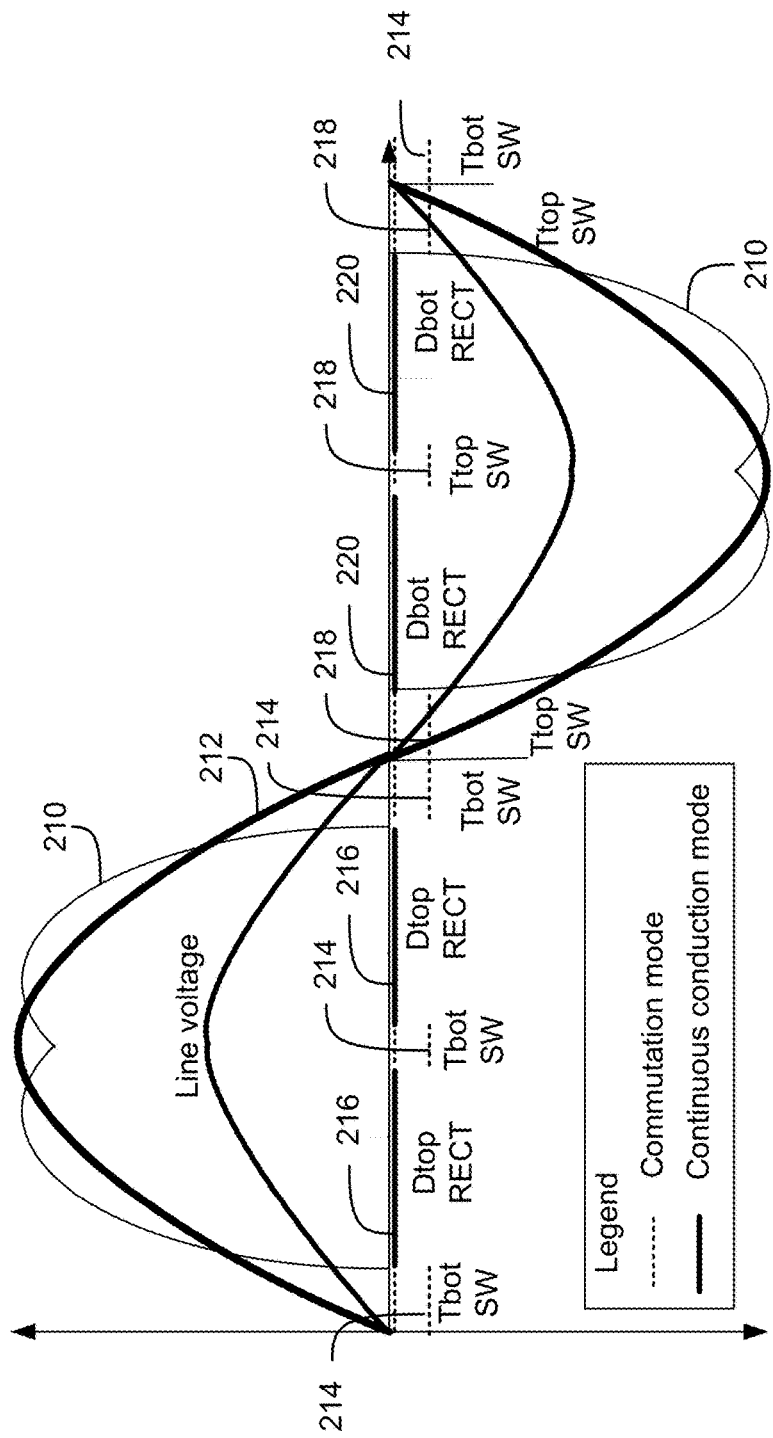
FIG. 2 depicts curves of current conduction of a 3-phase hybrid rectifier according to some embodiments.

Referring to FIG. 2, there is shown a diagram depicting curves of a three-phase diode rectifier current 210, a sinusoidal reference current (e.g. "ideal") 212, and conduction through the hybrid rectifier for a bottom transistor (commutation mode) 214, a top diode (continuous conduction mode) 216, a top transistor (commutation mode) 218, and a bottom diode (continuous conduction mode) 220. A control strategy, as may be implemented by a hybrid-rectifier controller (e.g. hybrid-rectifier controller 118a), can be explained in reference to FIG. 2.

As shown in FIG. 2, a control strategy can be determined such that, during the positive current portion of an alternating current through the diode rectifier 210, there is conduction through the bottom transistor 214 whenever the line current is below the sinusoidal reference current 212. When the line current is above the sinusoidal reference current 212, then conduction is through the top diode 216.

Similarly, for the negative current portion, there is conduction through the top transistor 218 whenever the line current is above the sinusoidal reference current 212. When the line current is below the sinusoidal reference current 212, then the conduction is through the bottom diode 220.

The control strategy disclosed here can be used for any or all of the following five objects.

First, transistor switching can be kept to a minimum, and mostly in the region of the line cycle, where low amplitude line current flows. This can be seen in the conduction of the bottom transistor 214 and the top transistor 218 in FIG. 2. According to some embodiments, this can reduce the commutation losses in the transistors, diodes, and line inductors.

Second, in reference to the conduction of the top diode 216 and the bottom diode 220, most of the high current conduction is done by the diodes that generally have lower conduction losses than the transistors.

Third, packaging the circuit (e.g. including the rectifier switches and an associated hybrid-rectifier controller) can be facilitated since the controls are relatively simple (e.g. as compared to an active rectifier), such that each pair of transistors and diodes (i.e. the top rectifier switch and the bottom rectifier switch for a single phase) operate independently.

Fourth, the harmonic levels produced by the hybrid rectifier can be managed, for example, in regards to a particular regulation such as IEEE 519. According to some embodiments, achieving better harmonic levels than proscribed by a particular regulation are not necessary.

Fifth, DC bus voltage ripple can be kept in line with that of an active rectifier, which is significantly lower than a diode rectifier. The effect of this is a reduction in the current distortion through the load.

According to some embodiments, the control strategy can use the line inductors (e.g. line inductors 120a, 120b, and 120c) and the transistor pulses to maintain the total current distortion demand (TDD-I) to an acceptable level.

In a simplified control strategy, the hybrid-rectifier controller doesn't need a precise synchronization with the line, which makes it more robust as compared to an active rectifier. In this case, the current reference is simply extracted from the line voltage.

In some cases, a pre-programmed control strategy can be used. This can be accomplished with a transistor switching pattern that can be adjusted with a simple feedback. For example, feedback from the line current as to adapt to the loading of the rectifier. Alternatively, the DC voltage with respect to the line voltage can be used to avoid entering the boosting mode (i.e. of an active rectifier) while reducing the DC voltage ripple.

Furthermore, a more elaborate control strategy can be used, which generates the transistor switching command in real time using the line voltage polarity and compares the line current amplitude to a reference. In this case, transistor switching occurs when the line current amplitude is lower than the reference. Essentially, the transistors maintain the current when it would be lower than the sinusoidal reference with a diode rectifier.

According to some embodiments, the hybrid-rectifier controller can be implemented with a PID (or similar) controller and basic logic in order to control the transistor pulse widths. More complex hybrid-rectifier controllers may be based on vector control, dead-beat control, or other advanced methods used to optimize the tradeoff between switching losses and the generation of harmonics.

Figure 3:
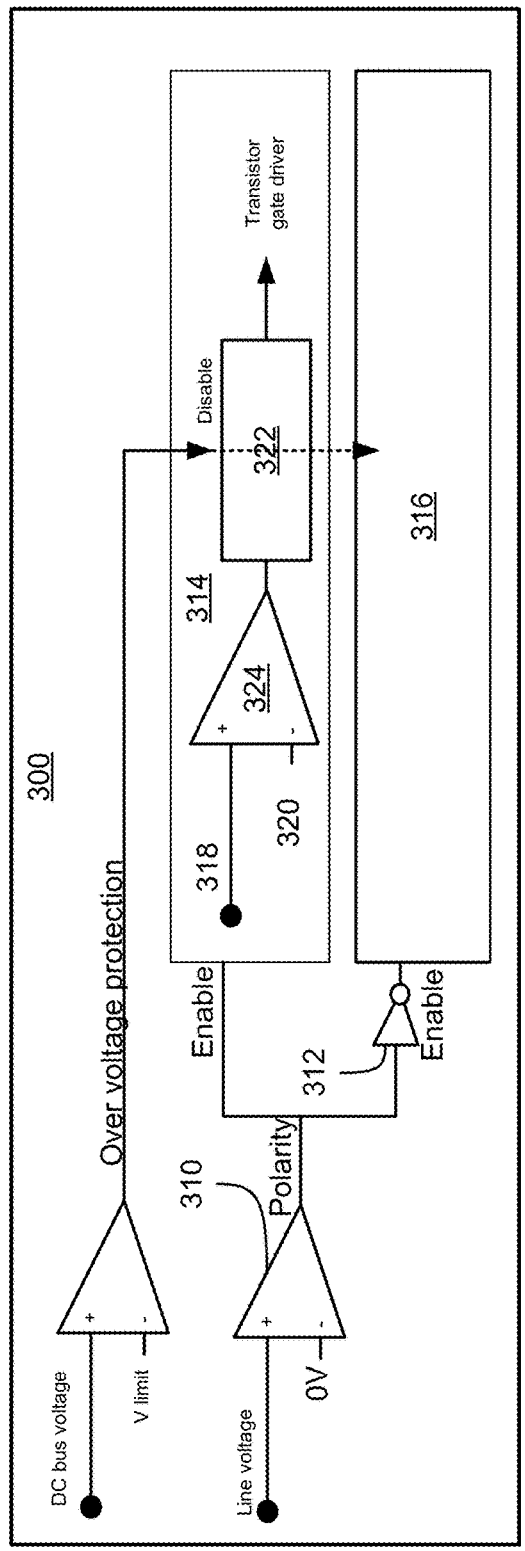
FIG. 3, is a schematic of a hybrid-rectifier controller according to some embodiments.

Referring to FIG. 3, there is shown a schematic of a simple hybrid-rectifier controller 300, such as may be used for each phase to provide independent control to that phase. The controller uses a voltage comparator 310 and an inverter 312 to only enable operation of the bottom transistors through the positive current controller 314 during the positive half-cycle and only the top transistors through the negative current controller 316 during the negative half cycle.

The hybrid rectifier controller 300 includes both a positive current controller 314 and a negative current controller 316, though only the details of the positive current controller 314 are shown. The analogous components of the negative current controller 316 are not shown in FIG. 3.

The transistor switching (e.g. the bottom transistor switching through the positive current controller 314) is activated when the diode current 318 is below a sinusoidal reference current 320. The sinusoidal reference current 320 may be generated to be in phase with the line voltage, as depicted in FIG. 2. A pulse-width modulator 322 is used to increase the pulse-width modulation (PWM) when the diode current 318 is below the sinusoidal reference current 320 (see also: the diode current 210 and the sinusoidal reference current 212 in FIG. 2) in order to sustain the current. The PWM is reduced to zero when diode current 318 is above the sinusoidal reference current 320 in order to stop the transistors.

A simple PI or PID error amplifier 324 can be used for the controller. In some application, a pre-programmed switching pattern that adapts to the load can be used. Other common error amplifier topologies can be suited for this application as well.

While the transistor switching can be accomplished using a pulse-width modulator 322, for example, by modulating the pulse width according to the output of the PID 324, other transistor switching schemes can also be used. For example, a hysteresis controller may be used to control the transistor switching.

The amplitude of the sinusoidal reference current 320 can be adjusted to generate the AC current needed to satisfy the load. According to some embodiments, this can be accomplished using any of the following techniques.

First, the line or the load current can be measured to derive the equivalent sinusoidal line current.

Second, the DC bus voltage can be used with respect to the line voltage. In this case, the amplitude of the sinusoidal reference current 320 is increased when the DC bus voltage is below the peak line-to-line voltage ($\sqrt{2}\ V_{LL}$) and decreased when it is above.

Figure 4:
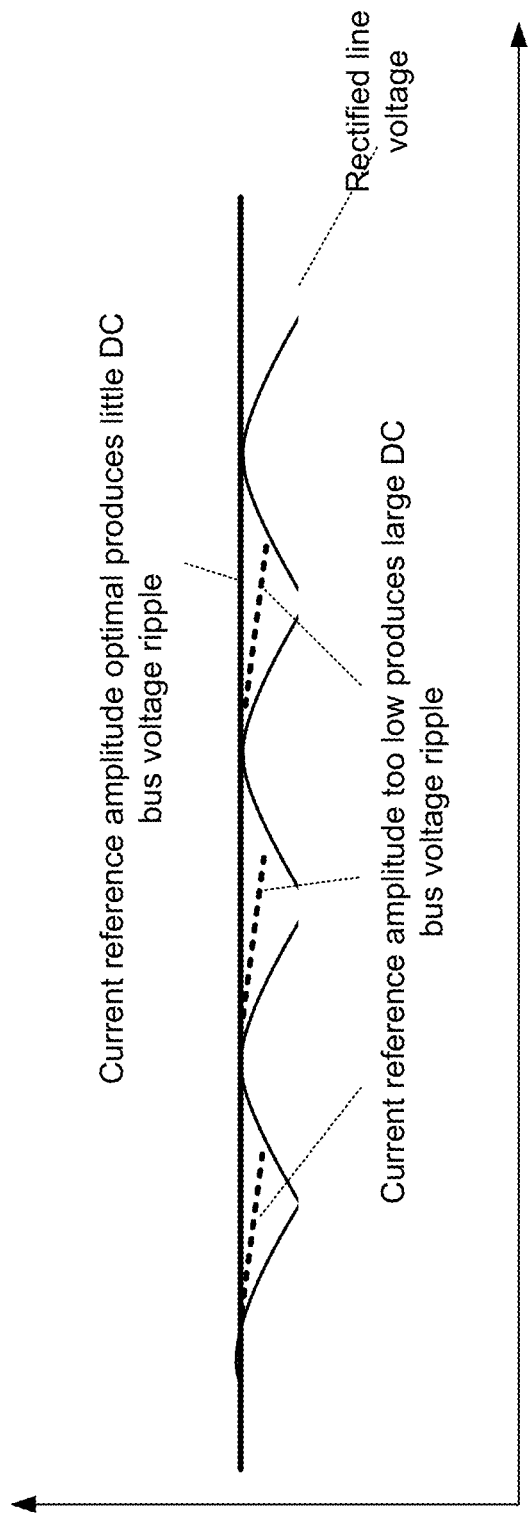
FIG. 4 depicts a DC bus voltage ripple, as may be used by a hybrid-rectifier controller according to some embodiments.

Third, the DC bus voltage ripple can be used to adjust the amplitude of the sinusoidal reference current 320. The optimal amplitude of the sinusoidal reference current 320 can be obtained when the ripple becomes relatively small, as shown in FIG. 4.

Fourth, a pre-calculated switching pattern can be saved in memory and simply scaled with the diode current 318 or the DC bus voltage.

According to some embodiments, some basic protections can be included in the hybrid rectifier, such as over-current and over-temperature protection for the transistors, and a switching disable level activated from the DC bus voltage.

Over-current and overt-temperature protections for the transistors reduce and eventually stop the commutation mode. Since the diodes can still operate, there can be a resulting increase in the harmonic distortion. However, the rectifier still operates, thus yielding a high availability.

A DC bus voltage protection level can be defined at a few percent above the expected DC voltage in order to stop the transistor switching until the DC bus voltage returns to an acceptable value. The ability to disable the DC bus can be used in case of a sudden removal of the load (load dump), where the transistor switching could raise the DC bus voltage to dangerous levels.

Figure 5:
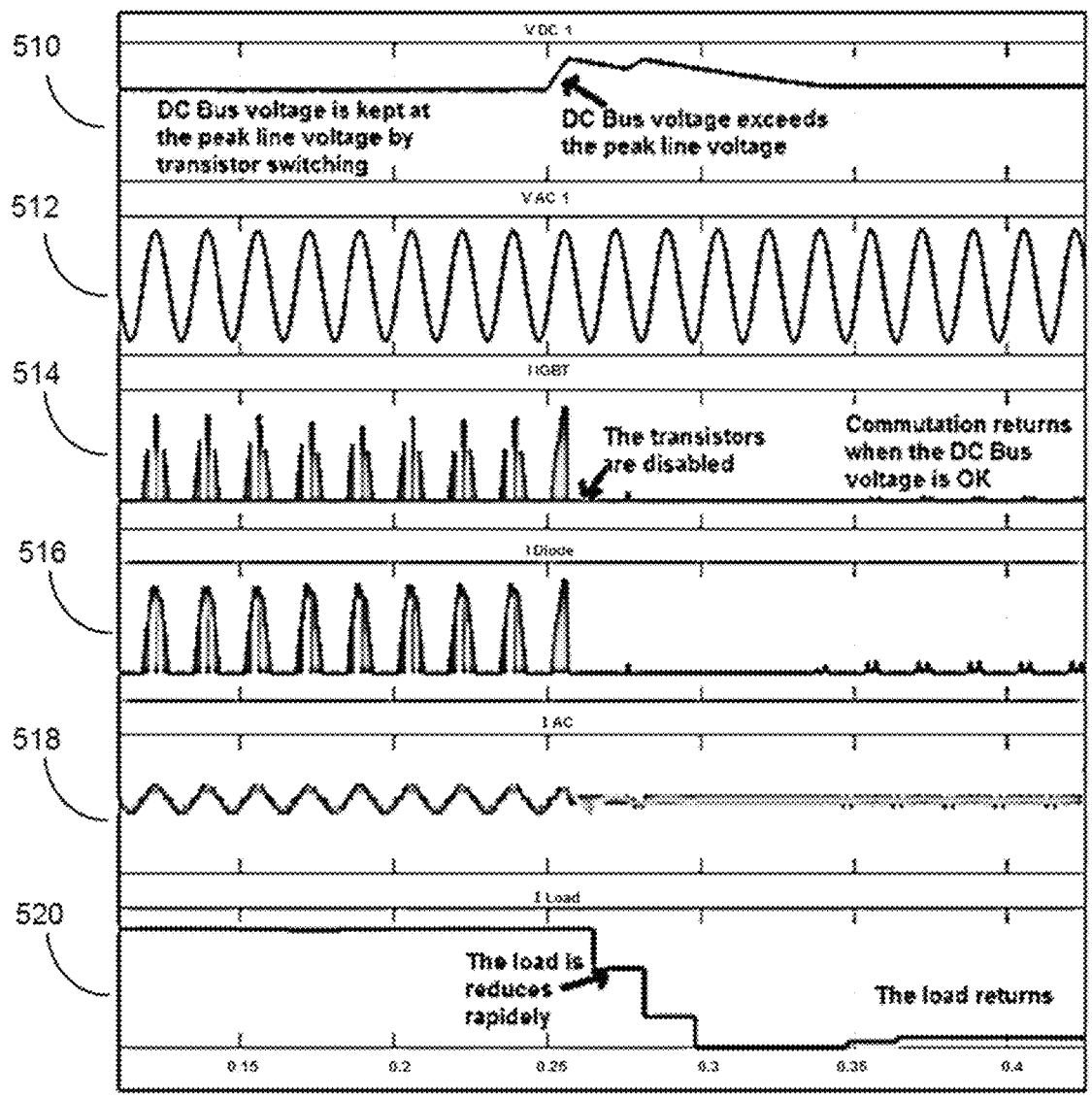
FIG. 5 depicts voltage and current curves during a load-dump protection, according to some embodiments.

The load dump protection produced disabling of the transistor switching is depicted in FIG. 5, in which 510 shows the DC bus voltage, 512 shows the AC voltage, 514 shows the transistor current, 516 shows the diode current, 518 shows the AC line current, and 520 shows the load current.

The load dump protection relies on a simple voltage comparator to detect the high DC bus voltage and stop the transistor switching altogether, until it returns to the desired value, as shown in FIG. 5. The load dump protection can also be combined with energy return (regenerative) applications of a hybrid rectifier circuit. Both the load dump protection and the energy return activate when the DC bus to rise above their set levels. The first level causes the transistors to stop, while the second, higher level triggers the energy return switching pattern.

Figure 6:
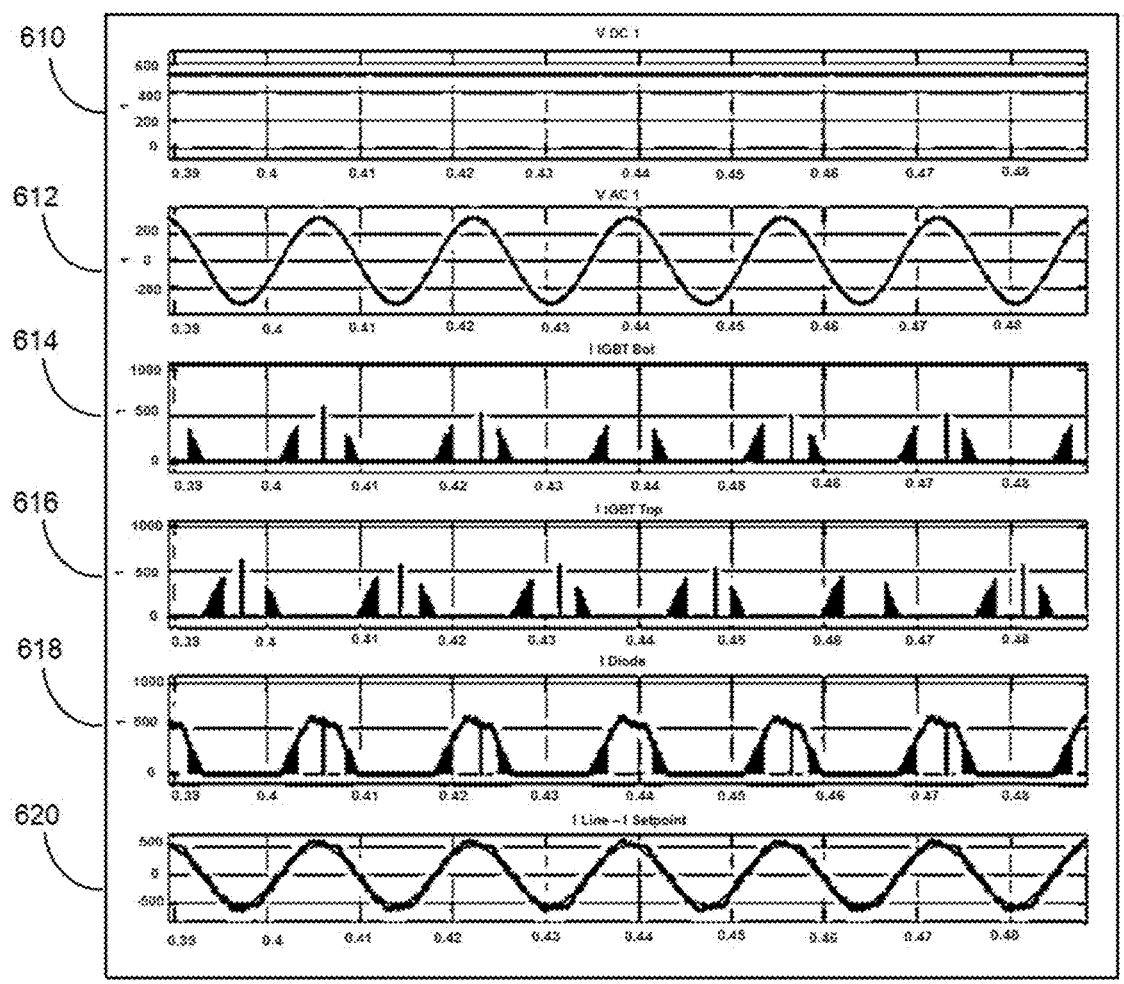
FIG. 6 depicts voltage and current curves showing the current through the diodes and transistors of a hybrid rectifier according to some embodiments.

Referring to FIG. 6, there is shown an example of the operation of one leg in a three-phase hybrid rectifier application. Other voltages or currents operate in a similar fashion.

The trace 610 shows the DC bus voltage for a $220V_{LN}/380\ V_{LL}$ source. FIG. 6 shows that the DC bus voltage is very close to the Vdc=$\sqrt{2}$ VLL=1.41*380 VLL=535 Vdc. The trace 612 shows the line voltage of $220V_{LN}$. The trace 614 shows the current through the bottom transistor, and the trace 616 shows the current through the top transistor. The trace 618 shows the top diode current, which is significantly higher than the current through the transistors shown in 614 and 616. The trace 620 shows the AC line current superimposed on the ideal current.

Figure 7:
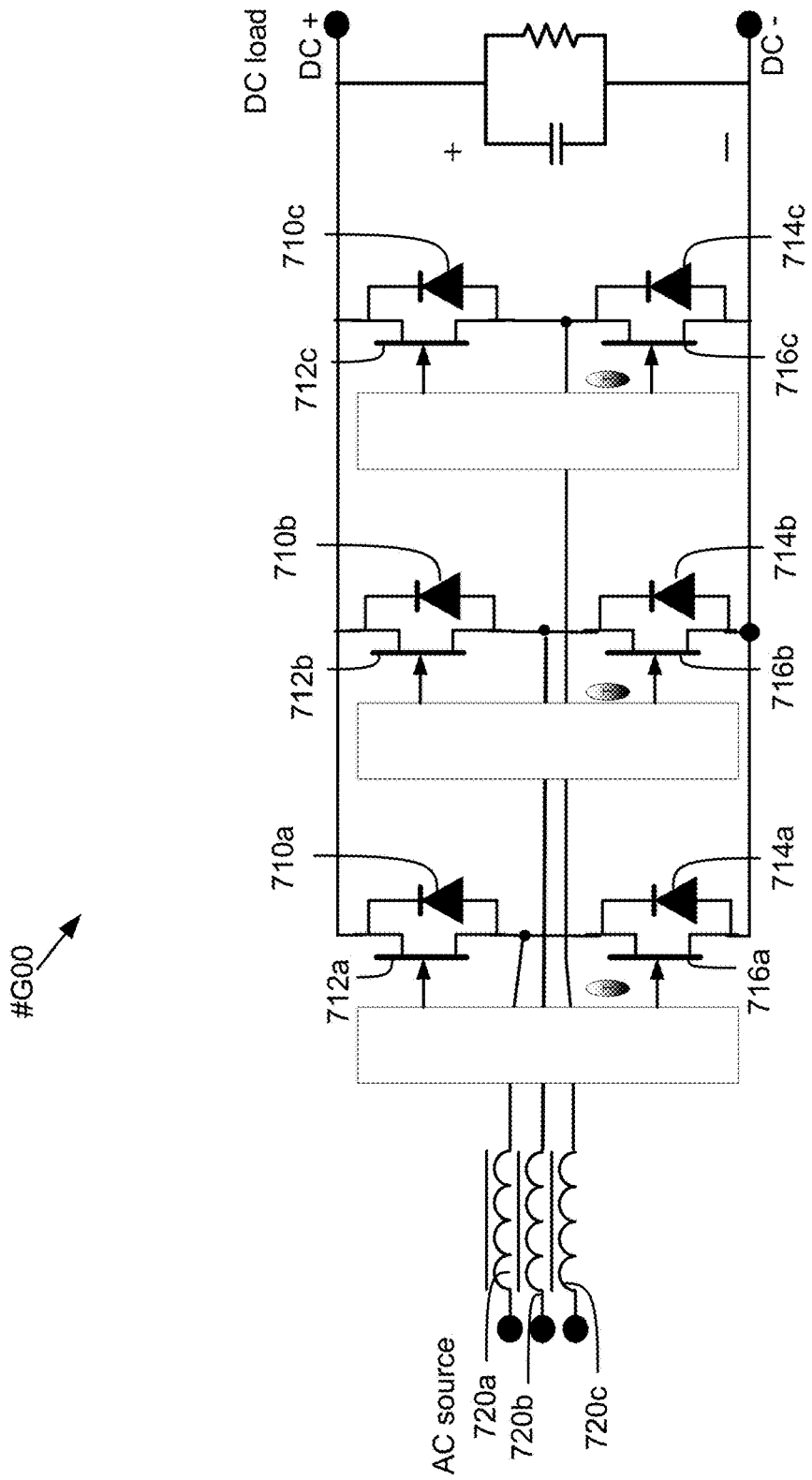
FIG. 7 is a circuit diagram of a hybrid rectifier using FETs according to some embodiments.

Referring to FIG. 7, and according to some embodiments, a hybrid rectifier 700 can be build using FETs as the top transistors 712a, 712b, 712c and bottom transistors 716a, 716b, 716c, in order to achieve both a synchronous rectifier as well as a current steering switch. This type of transistor can conduct in reverse instead of, or in parallel with, a diode, and switch as a transistor.

A hybrid rectifier built using FETs. FET transistors can be used as synchronous rectifiers, especially at low power, to conduct in reverse instead of the diodes, or, alternatively, along with the diodes. Thus, this can be used to reduce the number of components by eliminating the diodes (e.g. the diodes 712a, 712b, 712c, 714a, 714b, 714 shown in FIG. 7). Alternatively, the overall conduction losses can be reduced when operating the transistors in parallel with the diodes, as in the case of the hybrid rectifier 700 shown in FIG. 7.

According to some embodiments, a hybrid rectifier built using FETs reduces the number of semiconductors as compared with other rectifiers. Furthermore, when used with the simpler control strategy, rectifier modules can be produces that take advantage of the FET's properties in order to reduce costs. In the case of the hybrid rectifier disclosed herein, the FET is used as both a rectifier and a switch, according to the control strategies described above.

Figure 8:
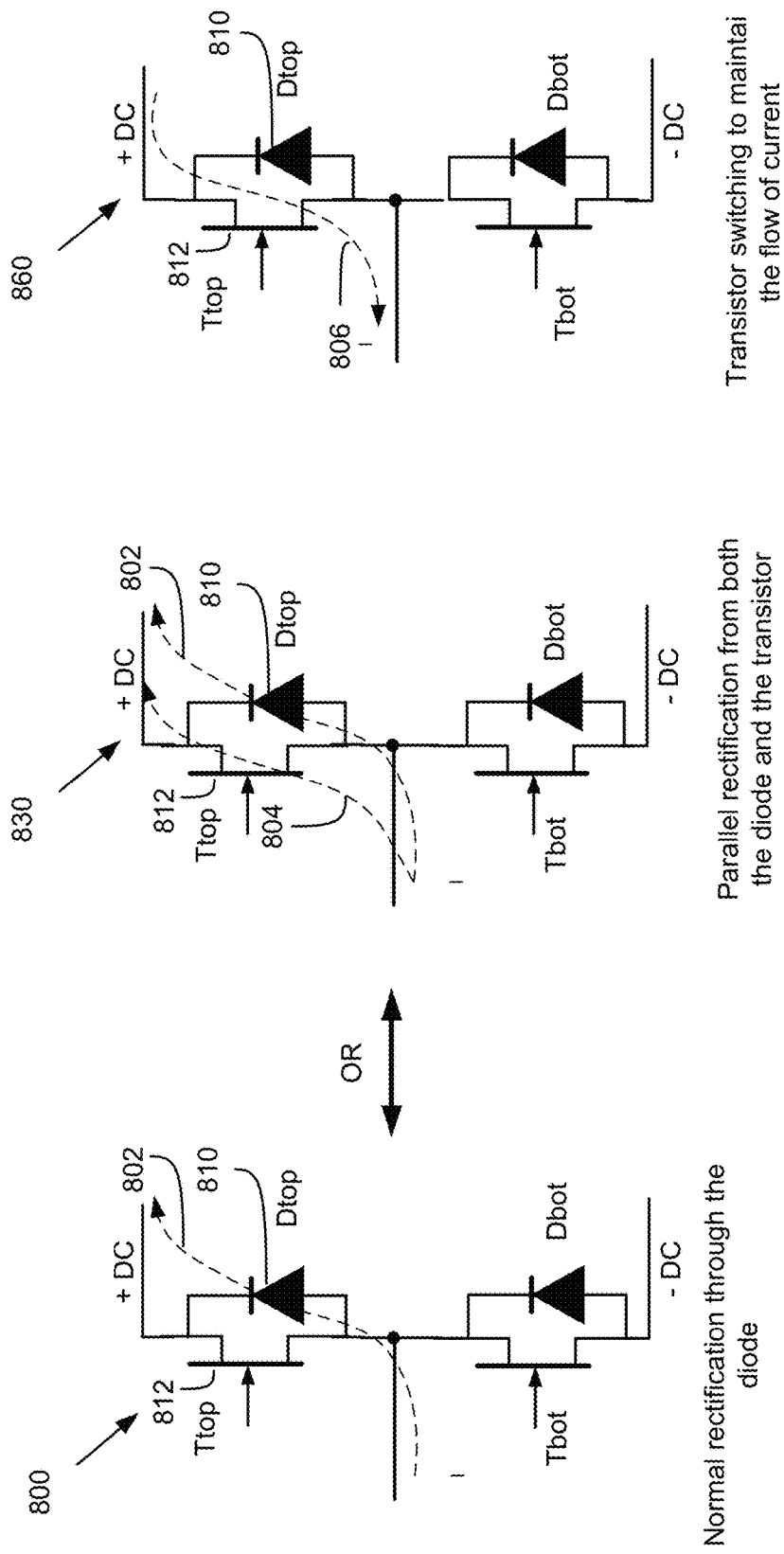
FIG. 8 is a circuit diagram depicting current flow during the operation of a hybrid rectifier using FETs in parallel with diodes, according to some embodiments.

The case of a FET in parallel with a diode is shown in FIG. 8. In FIG. 8, 800 shows rectification of a current 802 through a diode 810 only, 830 shows parallel rectification from both a current 802 through the diode 810 and a current 804 through the top transistor 812, and 860 shows that the top transistor 812 has been switched to maintain the flow of current 806. FIG. 8 depicts the positive current portion of the alternating current.

Figure 9:
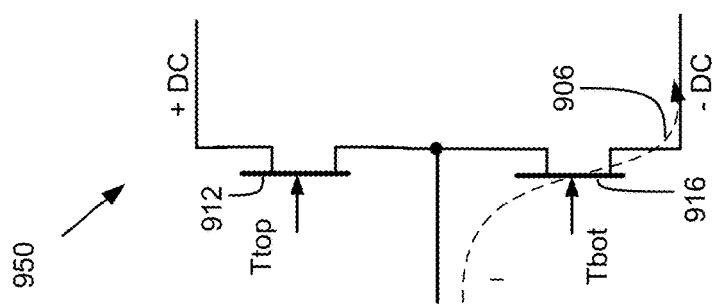
FIG. 9 is a circuit diagram depicting current flow during the operation of a hybrid rectifier using only FETs (and no diodes in parallel), according to some embodiments.
Figure 9:
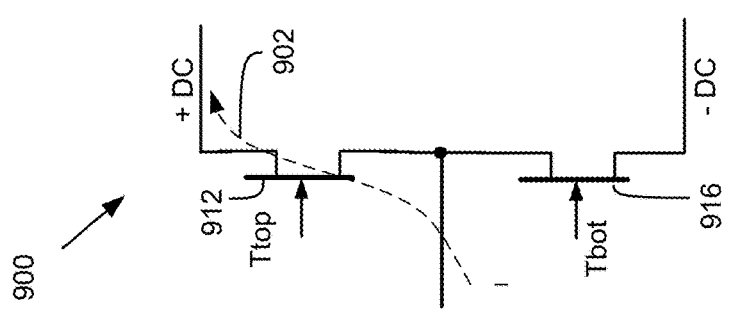

The case of a FET hybrid rectifier without the use a diode is shown FIG. 9. In FIG. 9, 900 shows rectification of a current 902 through the top transistor 912 and 950 shows that the top transistor 912 has been switched to maintain the flow of current 906 through the bottom transistor 916. FIG. 9 depicts the positive current portion of the alternating current.

Figure 10:
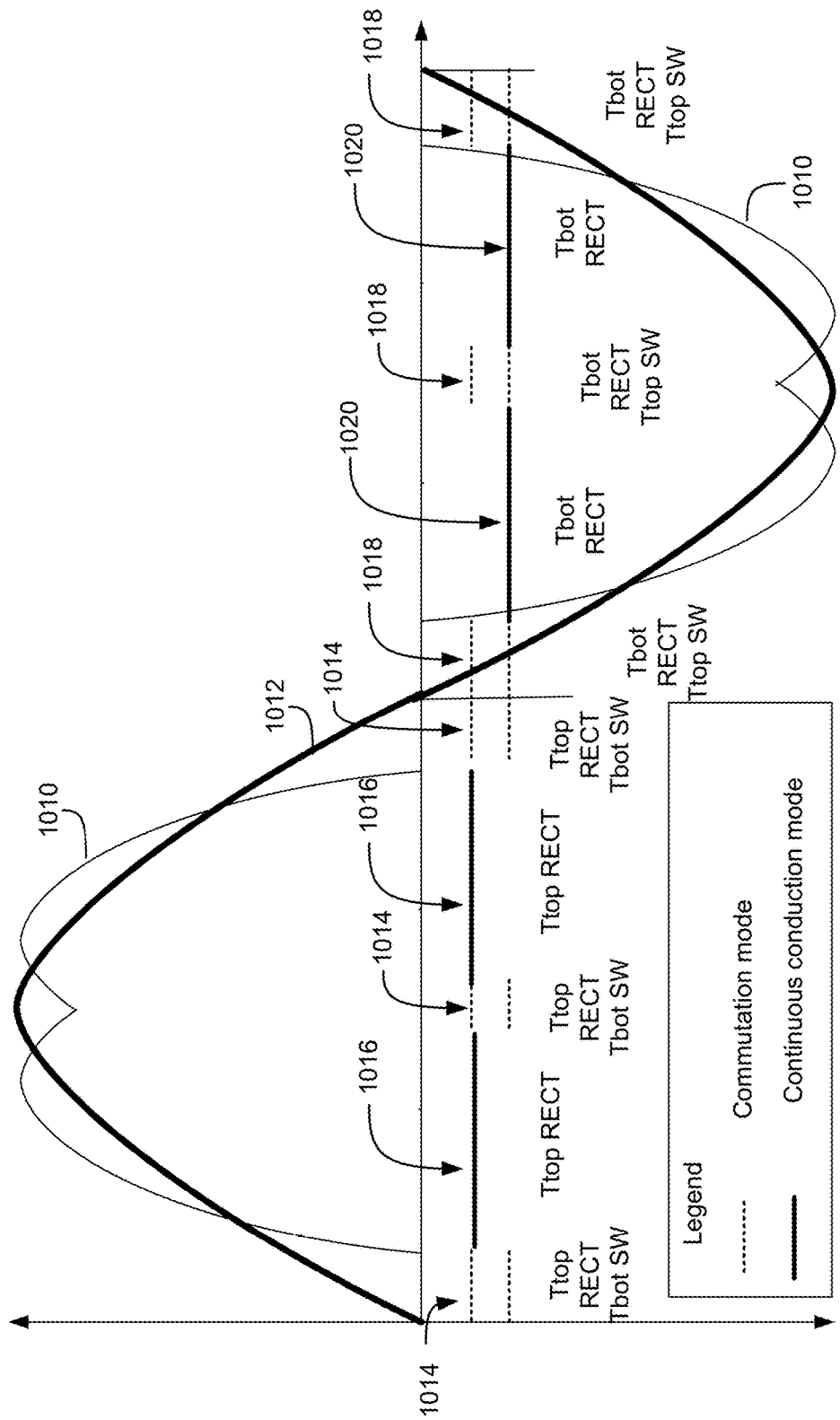
FIG. 10 depicts curves of current conduction of a 3-phase hybrid rectifier using FETs according to some embodiments.

Referring to FIG. 10, there is shown a diagram depicting curves of a three-phase rectifier current 1010, a sinusoidal reference current (e.g. "ideal") 1012, and conduction for a FET hybrid rectifier, through the top FET while the bottom FET is switched (commutation mode) 1014, through the top FET (continuous conduction mode) 1016, through the bottom FET while the top FET is switched (commutation mode) 1018, and through the bottom FET (continuous conduction mode) 1020. A control strategy, as may be implemented by a hybrid-rectifier controller (e.g. hybrid-rectifier controller 118a), based on FIG. 10, in a similar manner as was described for the control strategy based on FIG. 2.

As shown in FIG. 10, a control strategy can be determined such that, during the positive current portion of an alternating current, the top FET rectifies the current while the bottom FET is switched whenever the line current is below the sinusoidal reference current 1012. When the line current is above the sinusoidal reference current 1012, then conduction is through the top FET 1016. An analogous strategy is extended to the negative current portion of the alternating current accordingly.

A hybrid rectifier may be used for a range of applications, including uninterruptible power supplies (UPS), large DC power supplies (e.g. for plasma torches, welders, radar transmitters, electrochemistry, etc.), HVDC power distribution lines, and battery chargers and traction supplies.

Furthermore, the hybrid rectifier can be used with variable-speed drives and other AC/DC/AC converters with regenerative breaking and energy recovery. To this end, the hybrid rectifier may be suitable as a low, medium, and high-voltage rectifier.

According to some embodiments, a switching strategy can be used to return energy to the line when the DC bus is charged by a regenerative load such as a motor braking. This returns the energy in the line instead of dissipating the energy in a dynamic braking resistor as is currently the practice for diode rectifier applications. This can be accomplished with a hybrid rectifier using a control strategy similar to the simple control strategy previously described. In this way, contrary to the current practice using diode rectifiers, regeneration is possible with an efficient regeneration. For example, in a motor drive, the dynamic braking resistors are not needed to dissipate the braking energy. In regeneration, the transistors do most of the work, as in an active rectifier. The transistors also operate in the reverse direction of the diodes in rectification mode.

In many applications, such as motor-variable drives, it may be necessary to slow down the motor by dissipating some of the motor's kinetic energy. The usual technique on a simple motor drive involved dissipating the kinetic energy in a bank of resistors. This represents a loss of energy, which is wasteful. More complex and expensive active rectifier drives have the ability to return this energy to the line with fewer losses. With the use of the hybrid rectifier (including the control strategies) described here, during regeneration, the DC voltage is allowed to increase by a few percent, thereby blocking the operation of the diodes. When this happens, the transistors are commutated with a complementary strategy to that of rectification. In other words, the top transistors conduct during the positive line voltage, or by using another appropriate control scheme.

In essence, the regenerative mode of operating a hybrid rectifier can be seen as being the opposite (compliment) of the rectification strategies previously described. The regeneration mode can be activated when the DC bus voltage is at a sufficiently-high level. In the regeneration mode, the bottom transistors commutate during the positive current portion of the alternating current, and the top transistors commutate during the negative current portion of the alternating current.

Different modulation techniques may be used during the regeneration mode. For some applications, a pre-programmed pulse sequencing technique is sufficient. Typically, regeneration current is relatively low and occurs for a relatively short time, such that harmonic distortion does not become a significant problem. This makes a simple control strategy acceptable. Generally, the regenerative current should be limited to the capacity of the transistors selected for the circuit. In cases when full regeneration is required or preferred, fully-rated transistors can be used in the rectifier.

According to some embodiments, the hybrid rectifier circuit can be used as a hybrid filter, for example, as an alternative to a parallel harmonic filter.

Active harmonic filters are often produced using complete active rectifier circuits that include line inductors and a DC capacitor bank, in parallel with a harmonic-generating load. Current sensors are added to the circuit to the harmonic-generating load in order to measure the harmonic content so that an inverted harmonic current can be injected to cancel the harmonic content from the harmonic-generating load. Various versions of this scheme are well known, and all require a boosted independent DC bus voltage and a control strategy that is more complex than that of this hybrid rectifier.

Figure 11:
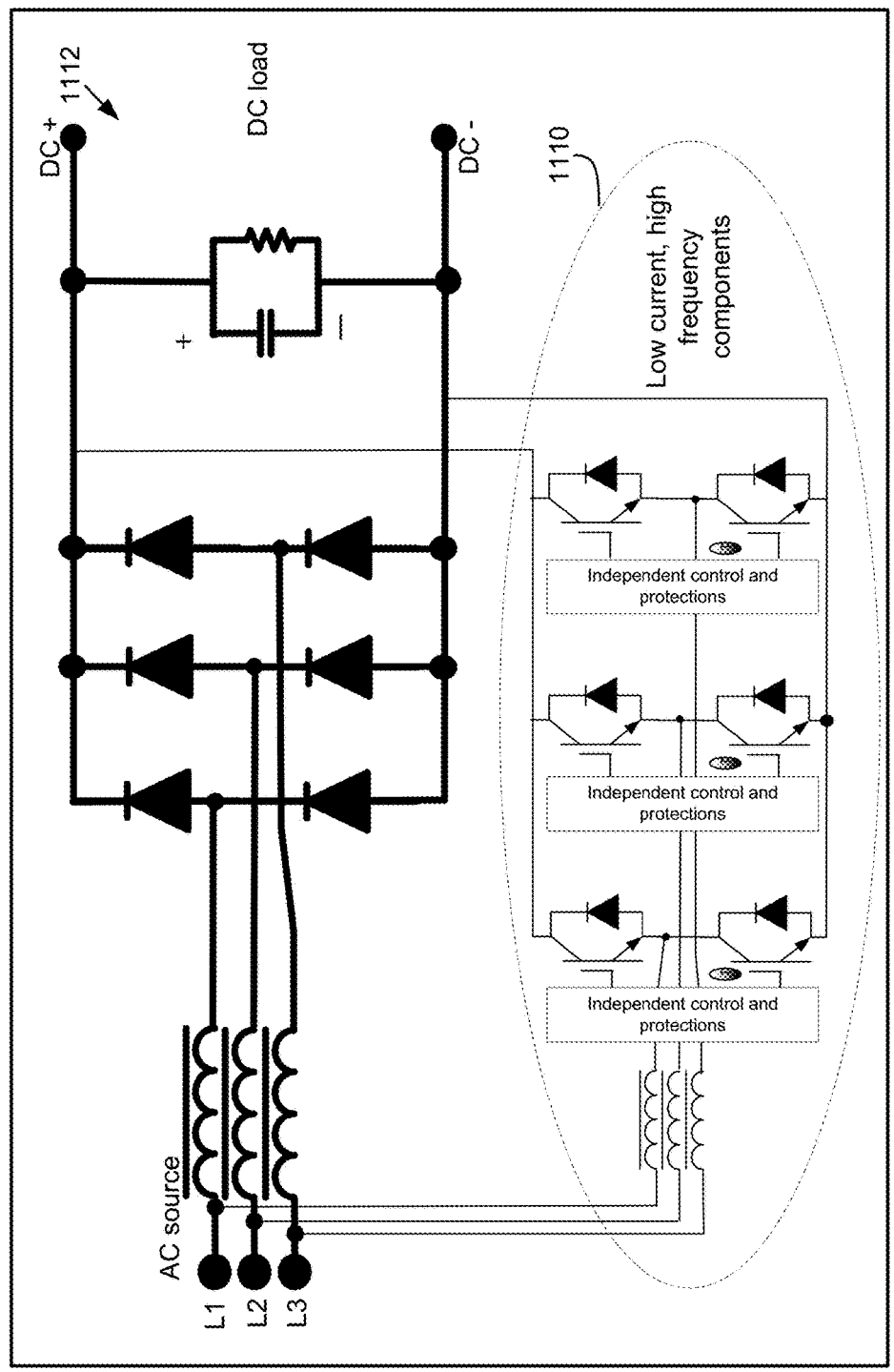
FIG. 11 is a circuit diagram of a hybrid rectifier used as a harmonic filter for a large rectifier according to some embodiments.

Referring to FIG. 11, there is shown a hybrid rectifier circuit 1110. The hybrid rectifier circuit 1110 can be used as a hybrid filter in order to separate the low frequency, high-power rectifier components of the larger rectifier 1112 from the hybrid rectifier 1110. In some cases, the control strategies previously described for the hybrid rectifier may be capable of providing the required filtering. Contrary to an active harmonic filter, the hybrid rectifier 1110 can add a regeneration capability to the diode rectifier. Such a configuration may be suitable for retrofitting to an existing rectifier, or when the high-power rectifier components are too slow to handle the high-frequency current pulses from the transistors.

As shown in FIG. 11, the hybrid rectifier 1110 can be used as a parallel harmonic filter using the DC bus of the main rectifier 1112. In this case, the hybrid rectifier 1110 and its line inductors can be connected in parallel with an existing high-power rectifier 1112 to minimize the harmonics through the use of the simple control strategy of the hybrid rectifier 1110.

Furthermore, some of the simple control strategies, as previously described, don't require supplementary current sensors to measure the harmonics generated by the high-power rectifier 1112

As previously provided, a hybrid rectifier may be used in order to achieve lower costs than an analogous active rectifier. This can be seen, for example, in cases when the current capacity of the transistors is much lower than that of less-expensive diodes. In this case, the control strategies described above are advantageous, since they direct most of the current conduction to the diodes for rectification, and keep the switching losses relatively low. In such a case, the total rectifier costs can be reduced to between that of an active rectifier and a diode rectifier. According to some embodiments, each phase of the rectifier circuit can be assembled out of discrete components on a printed circuit board ("PCB"), or assembled in an intelligent power module, or produced as an integrated circuit. Medium and high-voltage rectifiers may also benefit from this feature, since the transistors are very expensive at this power level.

Generally speaking, for any particular hybrid rectifier, component selection (e.g. transistors and/or diodes) can be optimized with respect to cost and efficiency. The main gain in efficiency comes from a reduction in the conduction loses through the transistors, since most of the current conduction is transferred through the diodes. Another gain in efficiency may be seen based on a reduction in the transistor switching losses, since the transistors are switching mostly at lower current and operating at lower DC bus voltages. The switching losses are related to the square of the DC bus voltage. Thus, reducing the DC bus voltage by 15% to 20% can result in a savings of 30% of the switching losses.

Figure 12:
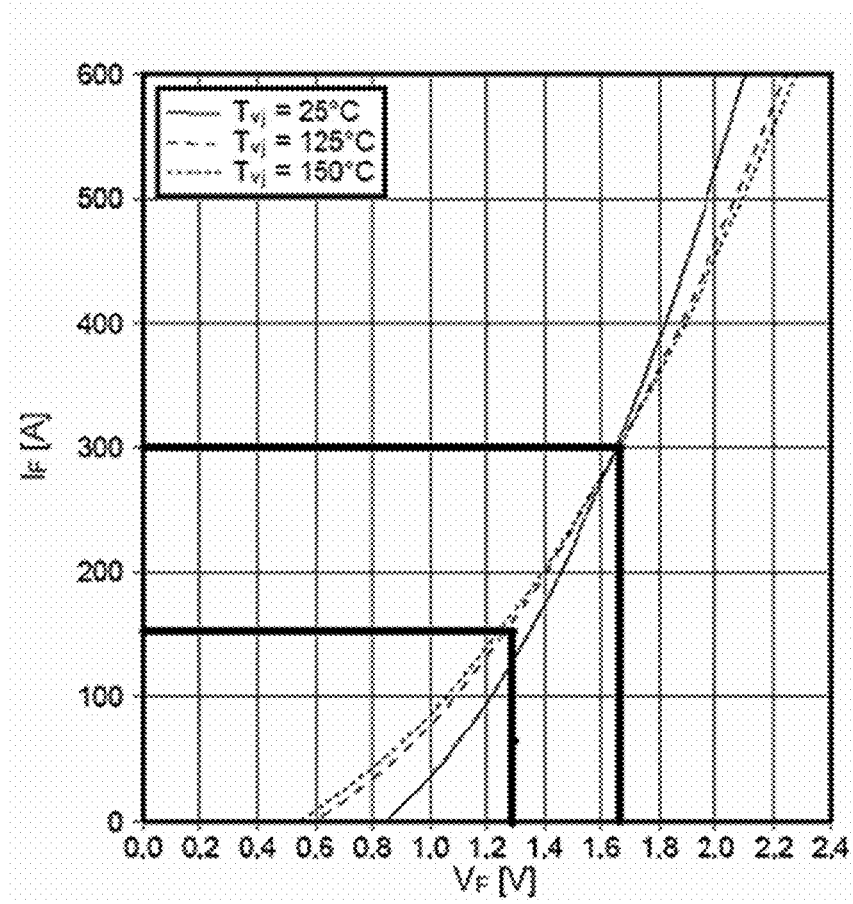
FIG. 12 depicts curves showing average diode forward voltage drop for a typical 300A rectifier.

Conduction losses can also be related to the size of the components selected. For example, using a hybrid rectifier in a particular application rather than an active rectifier may reduce the transistors' conduction losses to 15% of the diodes', as can be seen in FIG. 6. (Note: FIG. 12 show the losses for the active front end. Not needed here. The original figure was the simulation calculation but this is confusing. It is better to remove FIG. 12 altogether)

In many cases, the conduction losses are proportional to the current and the voltage drop across a device. In most active rectifier designs, the diodes and the transistors are sized to have similar voltage drops. This means that for similarly-designed parameters, the size of the transistors in the hybrid rectifier is approximately 15% of the size of the diodes. With this in mind, a reduction in cost can be achieved by using smaller transistors, giving consideration to the fact that transistors are typically more expensive than diodes.

The losses can be optimized by using larger diodes to reduce their conduction losses even further, with less impact on the overall cost of the rectifier than what would be possible with an active rectifier.

For example, doubling the diode size is equivalent to reducing the operating current by half. For a typical power diode, the voltage drop may be reduced from 1.65V to 1.25V, thus saving 25% of the conduction losses for a relatively small increase in cost. This relationship is represented by the curves in FIG. 12 for 150 A and 300 A current levels.

According to some embodiments, transistor cost reduction can be achieved due to the fact that the transistors conduct current for a relatively short period and at low amplitude (e.g. 15%) through a hybrid rectifier, as compared to an active rectifier (e.g. >90%). Thus, the transistors in a hybrid rectifier can be smaller and therefore less expensive. This can be significant, considering that transistors are generally more expensive than diodes. Furthermore, in larger systems, the smaller transistors also reduce the gate driver current and its associated auxiliary power supply, thus enabling the use of simplified gate-driver technologies. In larger systems, this can simplify or eliminate the task of connecting transistors in parallel to achieve the needed power.

According to some embodiments, the simple control strategy for each phase may be integrated with each transistor in an intelligent power module (IPM). In a typical active rectifier, the control for all the phases is done by central processor that coordinates all of the transistor switching, which requires many sensors and signal isolation in order to transfer the switching commands. However, with a hybrid-rectifier controller, each phase can be independent and the associated logic can be implemented in a simple module requiring fewer integrated sensors as compared to the active rectifier. This can eliminate the need for complex signal isolation and a central controller.

The present invention has been described here by way of example only. Various modification and variations may be made to these exemplary embodiments without departing from the spirit and scope of the invention, which is limited only by the appended claims.

I claim:
1. A hybrid rectifier circuit for rectifying a line current, comprising:
   a top rectifier switch comprising a top diode for conducting current during a positive current portion of the line current; and
   a top transistor connected in parallel to the top diode;
   a bottom rectifier switch comprising a bottom diode for conducting current during a negative current portion of the line current; and
   a bottom transistor connected in parallel to the bottom diode; and
   a hybrid-rectifier controller connected to the top transistor and the bottom transistor for switching the top transistor and the bottom transistor, such that:
      during the positive current portion of the line current:
         switch the bottom transistor so that the bottom transistor conducts current when the line current is below a sinusoidal reference current, and
         switch the bottom transistor so that the bottom transistor does not conduct current when the line current is above the sinusoidal reference current; and
      during the negative current portion of the line current:
         switch the top transistor so that the top transistor conducts current when the line current is above the sinusoidal reference current, and
         switch the top transistor so that the top transistor does not conduct current when the line current is below the sinusoidal reference current.

2. The hybrid rectifier circuit of claim 1, wherein the line current is a three-phase line current, the top and bottom rectifier switches pertain to a first phase of the three-phase line current, and the hybrid-rectifier controller comprises at least one hybrid-rectifier controller the hybrid rectifier further comprising:
   a second top rectifier switch comprising a second top diode in parallel with a second top transistor and a second bottom rectifier switch comprising a second bottom transistor and a second bottom diode, the second top and bottom rectifier switches pertaining to a second phase of the three-phase current; and
   a third top rectifier switch comprising a third top diode in parallel with a third top transistor and a third bottom rectifier switch comprising a third bottom transistor and a third bottom diode, the third top and bottom rectifier switches pertaining to a third phase of the three-phase current;
   wherein the at least one hybrid-rectifier controller is further configured to:
      during a positive current portion of the second phase of the line current:
         switch the second bottom transistor so that the second bottom transistor conducts current when a second line current is below a top reference value, and
         switch the second bottom transistor so that the second bottom transistor does not conduct current when the second line current is above the sinusoidal reference current; and during a negative current portion of the second phase of the line current:
  switch the second top transistor so that the second top transistor does not conduct current when the second line current is above the sinusoidal reference current, and
  switch the second top transistor so that the second top transistor does not conduct current when the second line current is below the sinusoidal reference current;
during a positive current portion of the third phase of the line current:
  switch the third bottom transistor so that the third bottom transistor conducts current when the third line current is below the sinusoidal reference current, and
  switch the third bottom transistor so that the third bottom transistor does not conduct current when the third line current is above the sinusoidal reference current; and
during a negative current portion of the third phase of the line current:
  switch the third top transistor so that the third top transistor conduct current when the third line current is above the sinusoidal reference current, and
  switch the third top transistor so that the third top transistor does not conduct current when the third line current is below the sinusoidal reference current.

3. The hybrid rectifier circuit of claim 2, wherein the at least one hybrid-rectifier controller comprises a second hybrid-rectifier controller for controlling the second top transistor and the second bottom transistor, and a third hybrid-rectifier controller for controlling the third top transistor and the third bottom transistor.

4. The hybrid rectifier circuit of claim 1, wherein each of the top and bottom transistors comprises a field-effect transistor (FET).

5. The hybrid rectifier circuit of claim 1, wherein an amplitude of the sinusoidal reference current is adjusted based on a load.

6. The hybrid rectifier circuit of claim 1, wherein an amplitude of the sinusoidal reference current is adjusted based on a comparison of a DC bus voltage and a peak line-to-line voltage.

7. The hybrid rectifier circuit of claim 1, wherein a pulse-width modulator controls the switching of at least one of the top transistor and the bottom transistor.

8. The hybrid rectifier circuit of claim 1, wherein a hysteresis controller controls the switching of at least one of the top transistor and the bottom transistor.

9. A hybrid rectifier for filtering harmonics of a parallel high-power rectifier, comprising:
  the hybrid rectifier circuit according to claim 1 connected in parallel to the high-power rectifier.

10. A hybrid rectifier circuit for rectifying a line current, comprising:
  a top transistor for conducting current during a positive current portion of the line current and switching during a negative current portion of the line current;
  a bottom transistor for conducting current during the negative current portion of the line current and switching during the positive current portion of the line current; and
  a hybrid-rectifier controller connected to the top transistor and the bottom transistor for switching the top transistor and bottom transistor during the positive portion of the line current when the line current is below a sinusoidal reference current, and switching the bottom transistor and top transistor during the negative portion of the line current when the line current is above the sinusoidal reference current,
  wherein the line current is a three-phase line current, the top and bottom transistors pertain to a first phase of the three-phase line current, and the hybrid rectifier controller comprises at least one hybrid-rectifier controller, the hybrid rectifier further comprising:
  a second top transistor and a second bottom transistor, the second top and bottom transistors pertaining to a second phase of the three-phase line current;
  a third top transistor and a third bottom transistor, the third top and bottom transistors pertaining to a third phase of the three-phase line current;
  wherein the at least one hybrid-hybrid rectifier controller further switches the second top and bottom transistors during a positive portion of the second phase of the three-phase line current when the second phase of the three-phase line current is below the sinusoidal reference current, switches the second bottom and top transistors during a negative portion of the second phase of the three-phase line current when the second phase of the three-phase line current is above the sinusoidal reference current, switches the third top and bottom transistors during a positive portion of the third phase of the three-phase line current when the third phase of the three-phase line current is below the sinusoidal reference current, and switches the third bottom and top transistors during a negative portion of the third phase of the three-phase line current when the third phase of the three-phase line current is above the sinusoidal reference current.

11. The hybrid rectifier of claim 10, wherein each of the top and bottom transistors comprise a field-effect transistor (FET).

12. The hybrid rectifier of claim 10, wherein the at least one hybrid-rectifier controller comprises a second hybrid-rectifier controller for controlling the second top transistor and second bottom transistor, and a third hybrid-rectifier controller for controlling the third top transistor and the third bottom transistor.

13. A hybrid rectifier circuit for power regeneration, comprising:
  a top diode for conducting current during a positive current portion of the line current;
  a top transistor connected in parallel to the top diode;
  a bottom diode for conducting current during a negative current portion of the line current;
  a bottom transistor connected in parallel to the bottom diode; and
  a hybrid-rectifier controller connected to the top transistor and the bottom transistor for measuring a DC bus voltage, and when the DC bus voltage exceeds a regeneration trigger level, switching the top transistor and the bottom transistor, such that:
    during the positive current portion of the line current:
      switch the bottom transistor so that the bottom transistor conducts current when the line current is below a sinusoidal reference current, and
      switch the bottom transistor so that the bottom transistor does not conduct current when the line current is above the sinusoidal reference current; and during the negative current portion of the line current:
  switch the top transistor so that the top transistor conducts current when the line current is above the sinusoidal reference current, and
  switch the top transistor so that the top transistor does not conduct current when the line current is below the sinusoidal reference current.

14. The hybrid rectifier circuit of claim 13, further comprising a DC bus voltage protection, wherein the hybrid-rectifier controller further switches the top transistor and the bottom transistor off when the DC bus voltage exceeds a DC bus voltage protection level.

* * * * *